(12) United States Patent
Lin

(10) Patent No.: US 8,083,479 B2
(45) Date of Patent: Dec. 27, 2011

(54) HEAT DISSIPATING FAN STRUCTURE OF DUAL MOTOR

(75) Inventor: Chun-Ju Lin, Taipei County (TW)

(73) Assignee: Enermax Technology Corporation, Taoyuan, Taoyuan County (TW)

( * ) Notice: Subject to any disclaimer, the term of this patent is extended or adjusted under 35 U.S.C. 154(b) by 567 days.

(21) Appl. No.: 12/314,634

(22) Filed: Dec. 15, 2008

(65) Prior Publication Data

US 2010/0149753 A1  Jun. 17, 2010

(51) Int. Cl.
  *F01D 1/04* (2006.01)
(52) U.S. Cl. ............ 415/211.2; 415/173.6; 415/208.2; 415/208.5; 416/178; 416/186; 416/189
(58) Field of Classification Search ............ 415/119, 415/173.6, 200, 220, 181, 191, 208.2, 208.5, 415/211.2; 416/178, 186, 189, 234; 417/366, 417/354, 423, 369–371
See application file for complete search history.

(56) References Cited

U.S. PATENT DOCUMENTS

| | | | |
|---|---|---|---|
| 7,300,262 B2 * | 11/2007 | Ku et al. | 417/366 |
| 7,344,358 B2 * | 3/2008 | Lu et al. | 415/211.2 |
| 2006/0051221 A1 * | 3/2006 | Chen et al. | 417/423.8 |

* cited by examiner

*Primary Examiner* — Dung A. Le
(74) *Attorney, Agent, or Firm* — Muncy, Geissler, Olds & Lowe, PLLC

(57) ABSTRACT

A heat dissipating fan structure of a dual motor includes: a base device, having a fan base, and the fan base having a fan motor; a fan, connected and rotated by the fan motor, and the fan having a plurality of vanes; a support frame device, installed at the fan base, and having a frame-fan motor; a frame-fan device, connected and rotated by the frame-fan motor, and having a frame-fan frame, and a plurality wing plates disposed around the frame-fan frame, and the wing plates being disposed around the external periphery of the fan and perpendicular to the vane, so that the plurality wing plates on the frame-fan base can produce an auxiliary airflow to increase the airflow of the fan and give a better heat dissipating effect.

10 Claims, 5 Drawing Sheets

US 8,083,479 B2

HEAT DISSIPATING FAN STRUCTURE OF DUAL MOTOR

BACKGROUND OF THE INVENTION

1. Field of the Invention

The present invention generally relates to a heat dissipating fan structure, and more particularly to a heat dissipating fan structure of a dual motor capable of assisting sideway incoming air to produce a multi-directional, expanded, increased airflow to achieve a better heat dissipating or cooling effect.

2. Description of the Related Art

Present heat dissipating fan structures mainly use a motor to drive vanes to rotate and allow an airflow to pass linearly between the front and rear sides of the vane. Since the direction of the airflow produced by the fan is fixed, the area of action and the blowing effect of the airflow are restricted. If the present heat dissipating fan structures are applied for dissipating heat produced by a central processing unit (CPU) or a memory, the multi-directional and expanded airflow and its expected blowing effect cannot be achieved, and the heat dissipating or cooling effect is poor. Particularly, the performance of a computer device such as a CPU or a memory is enhanced, but the heat dissipating and blowing effects of the present existing fans cannot be improved accordingly, and thus there is an urgent need for a more efficient heat dissipating measure, and it is an important subject for the related industry to break through the existing technology and develop a heat dissipating fan structure to meet the requirement of high-performance heat dissipations.

In view of the aforementioned shortcomings of the prior art, the inventor of the present invention based on years of experience in the related industry to conduct extensive researches and experiments, and finally developed a heat dissipating fan structure of a dual motor in accordance with the present invention, in hope of serving the general public and promoting the development of the industry.

SUMMARY OF THE INVENTION

Therefore, it is a primary objective of the present invention to provide a heat dissipating fan structure of a dual motor, such that the fan provides an auxiliary airflow in a sideway direction, and the airflow of the fan is multidirectional or expanded to give a better heat dissipating or cooling effect, so as to improve the heat dissipating efficiency and the practical function of the fan.

To achieve the foregoing objective, the present invention provides a heat dissipating fan structure of a dual motor comprising: a base device, including a fan base, and the fan base including a fan motor; a fan, coupled and rotated by the fan motor, and including a plurality of vanes; a support frame device, installed at the fan base, and including a frame-fan motor; a frame-fan device, coupled and rotated by the frame-fan motor, and including a frame-fan frame, and the frame-fan frame having a plurality wing plates disposed around the frame-fan frame, and the wing plate being disposed around the external periphery of the fan and perpendicular to the vane, such that when air is blown at a desired heat dissipating object (such as a CPU), and the frame-fan frame drives and increases the airflow in a sideway direction, the present invention increases the airflow and concentrates the wind blowing towards the desired heat dissipating object to improve the heat dissipating effect. When air is extracted from the desired heat dissipating object (such as a CPU), the frame-fan frame drives and increases the hot air of the desired heat dissipating object extracted from the fan to improve the heat dissipating effect.

To make it easier for our examiner to understand the technical characteristics, features and effects of the present invention, preferred embodiments together with accompanying drawings are used for the detailed description of the invention as follows:

DETAILED DESCRIPTION OF THE PREFERRED EMBODIMENTS

Figure 1:
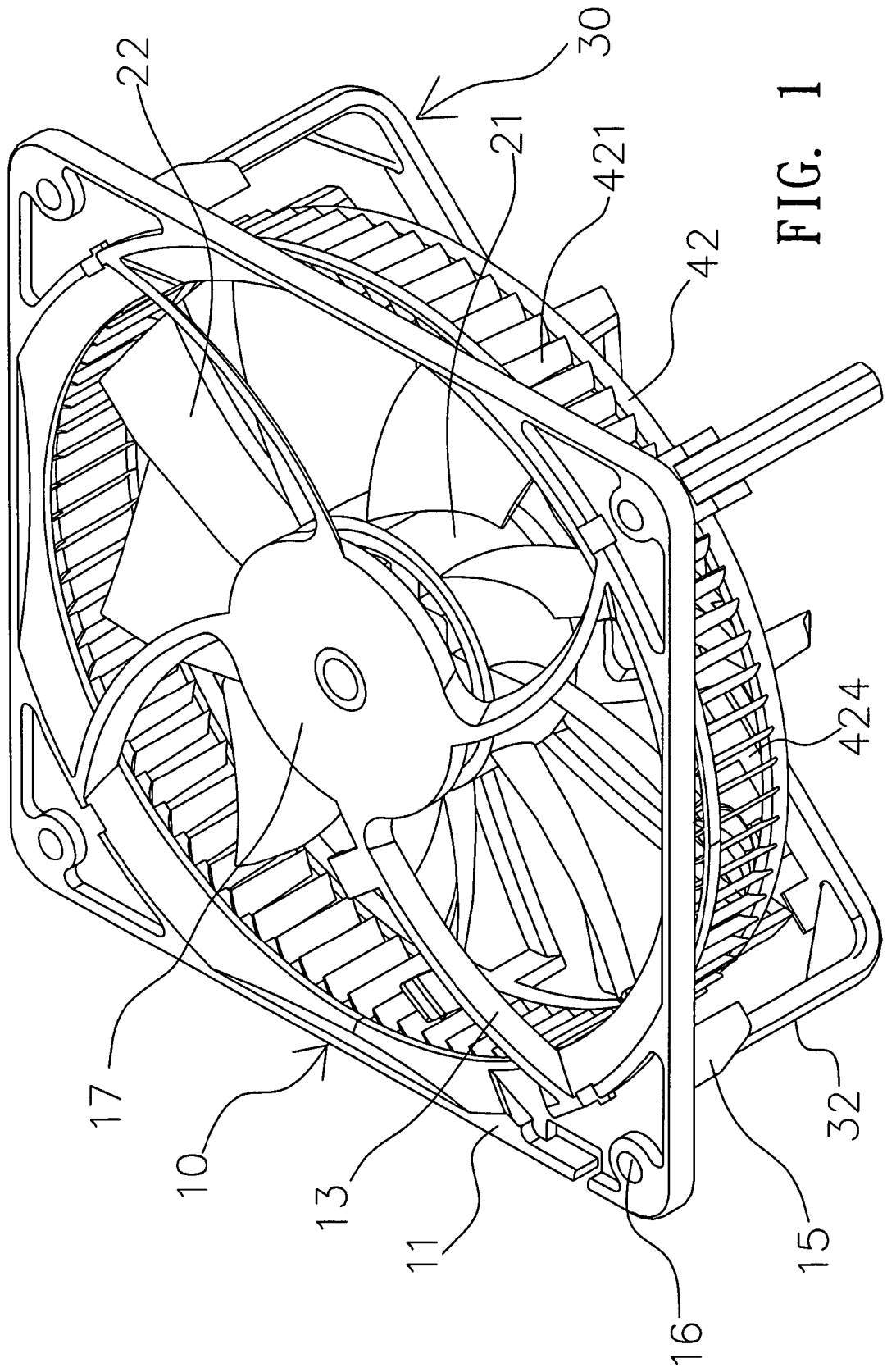
FIG. 1 is a perspective view of a structure of the present invention.

With reference to FIGS. 1 to 4 for a heat dissipating fan structure of a dual motor in accordance with the present invention, the fan structure comprises a base device 10, a fan 20, a support frame device 30 and a frame-fan device 40. The base device 10 includes a fan base 11, and the fan base 11 includes a motor base 17 disposed substantially at the center position of the fan base 11 for installing a fan motor 12, and the motor base 17 is coupled with the fan base 11 by a plurality of connecting portions 13 to form a plurality of through portions 14 separated by the connecting portions 13, and at least one connecting portion 13 selectively includes a hook plate 131. The fan motor 12 comprises a connecting axle hole 121; a fixing base 15 disposed separately at the corners and on the periphery of the fan base 11, and the fixing base 15 has an insert hole 151, and a latch notch 152 is disposed on an internal side of the bottom of the fixing base 15 and connected with the insert hole 151. In addition, a fixing hole 16 is disposed separately at the corners and on the periphery of the fan base 11 and corresponding to the external side of the fixing base 15 for facilitating the connection of the fan base 11.

The fan 20 includes a fan hub 21, and the center position of the fan hub 21 has a fan axle 23 inserted into a connecting axle hole 121 of the fan motor 12, such that the fan 20 is linked, driven and rotated by the fan motor 12, and the periphery of the fan hub 21 has a plurality of vanes 22, and a distal edge of the vane 22 has a curved protruding plate 221.

The support frame device 30 is installed on the fan base 11, and includes a support stand base 33 and a plurality of support stands 32 extended outward from the periphery of the support stand base 33, and the support stand base 33 includes a frame-fan motor 31, and the frame-fan motor 31 has a connecting axle hole 311. The support stand 32 is substantially L-shaped, and includes a connecting rib 322 disposed at an internal side of a bent position of the support stand 32 and a latch member 321 disposed on an internal side of the distal edge of the support stand 32. In addition, at least one support stand 32 selectively includes a plurality of hook plates 323 disposed at appropriate positions. When the support frame device 30 is assembled, the support stand 32 is inserted into and connected to an insert hole 151 of the fan base 11 and the latch member 321 of the support stand 32 is latched to the latch notch 152 of the fixing base 15, such that the support frame device 30 is fixed onto the fan base 11.

Figure 2:
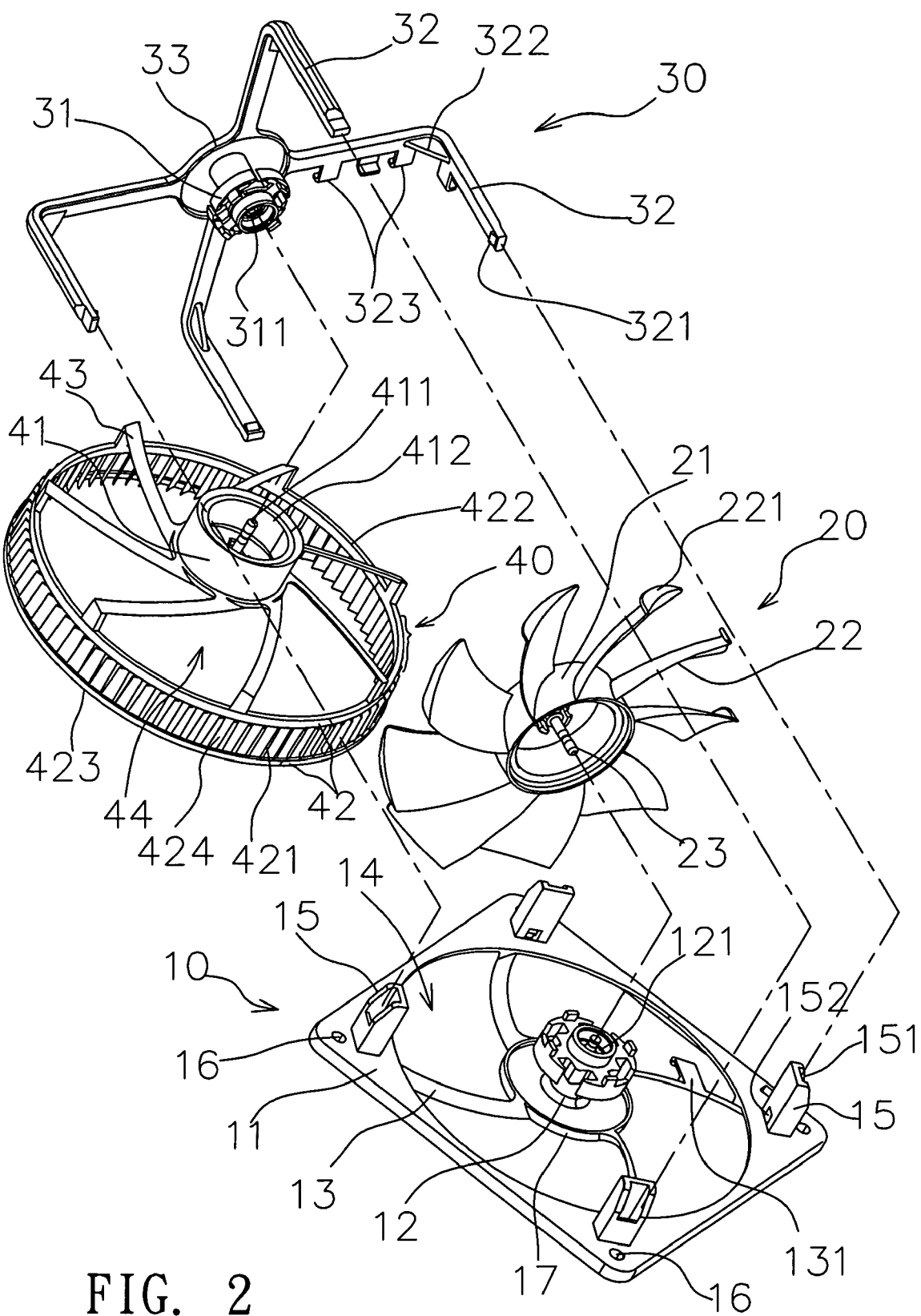
FIG. 2 is an exploded view of a structure of the present invention.
Figure 2A:
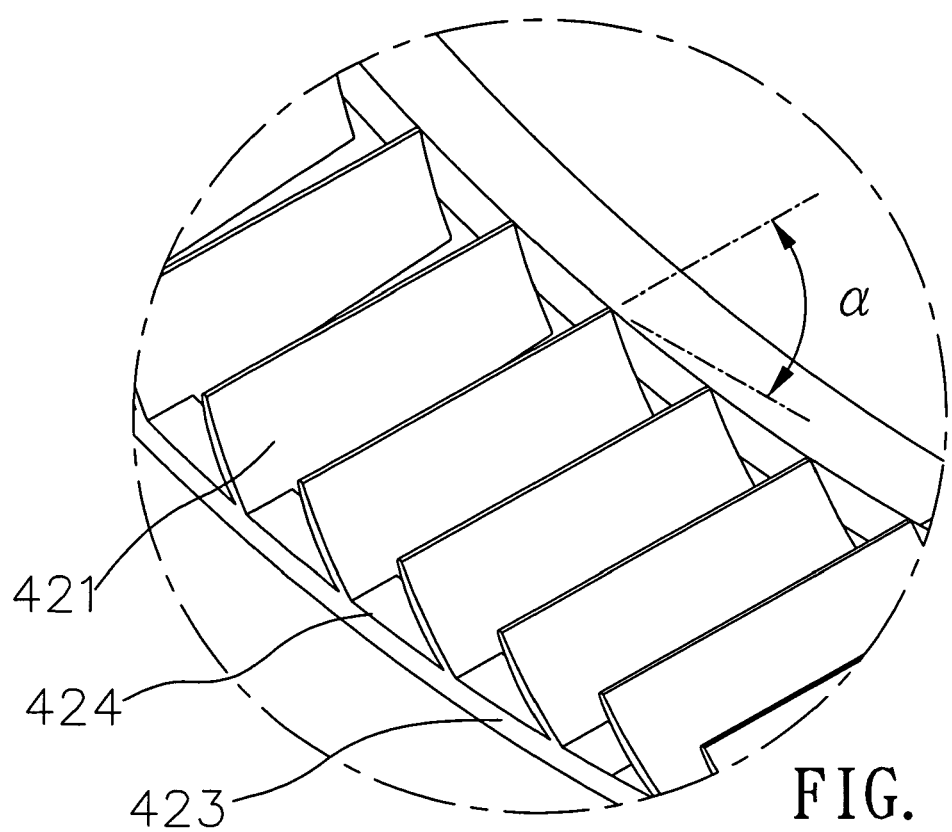
FIG. 2A is a schematic view of a horizontal angle of a wing plate on a frame-fan frame in accordance with the present invention.
Figure 2B:
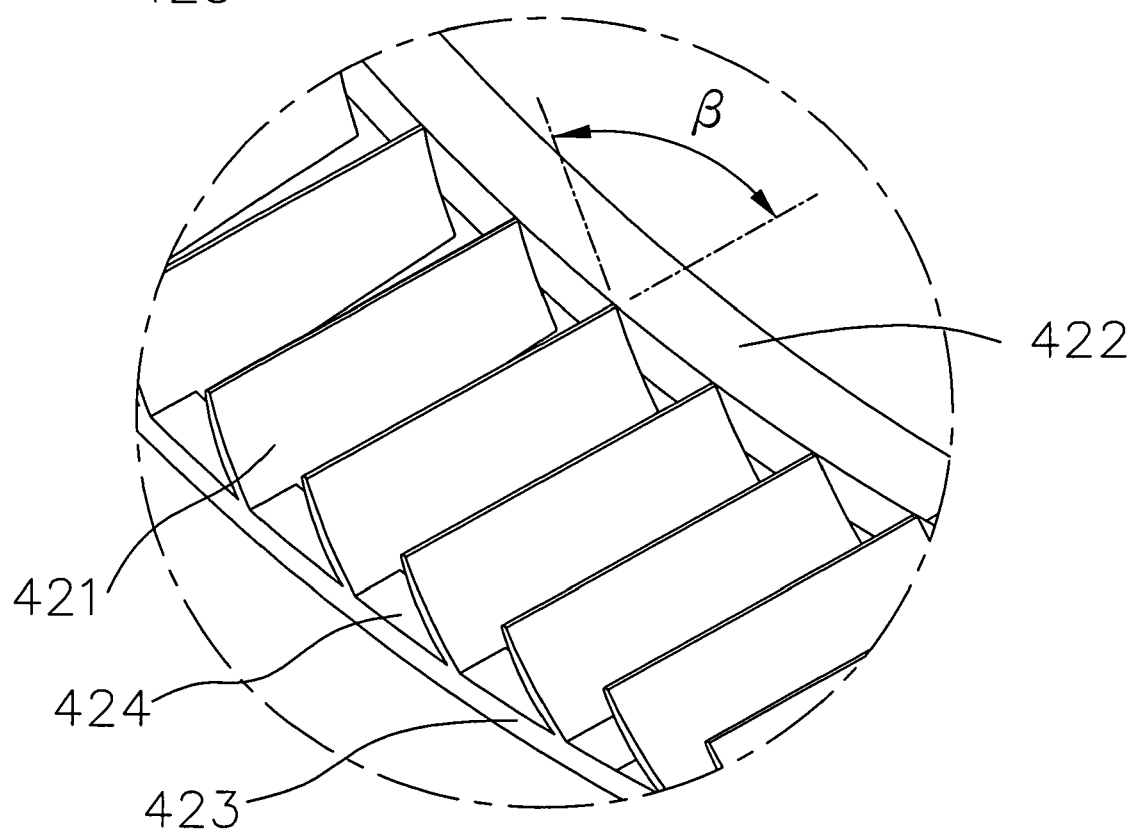
FIG. 2B is a schematic view of an inclination angle of a wing plate on a frame-fan frame in accordance with the present invention.
Figure 3:
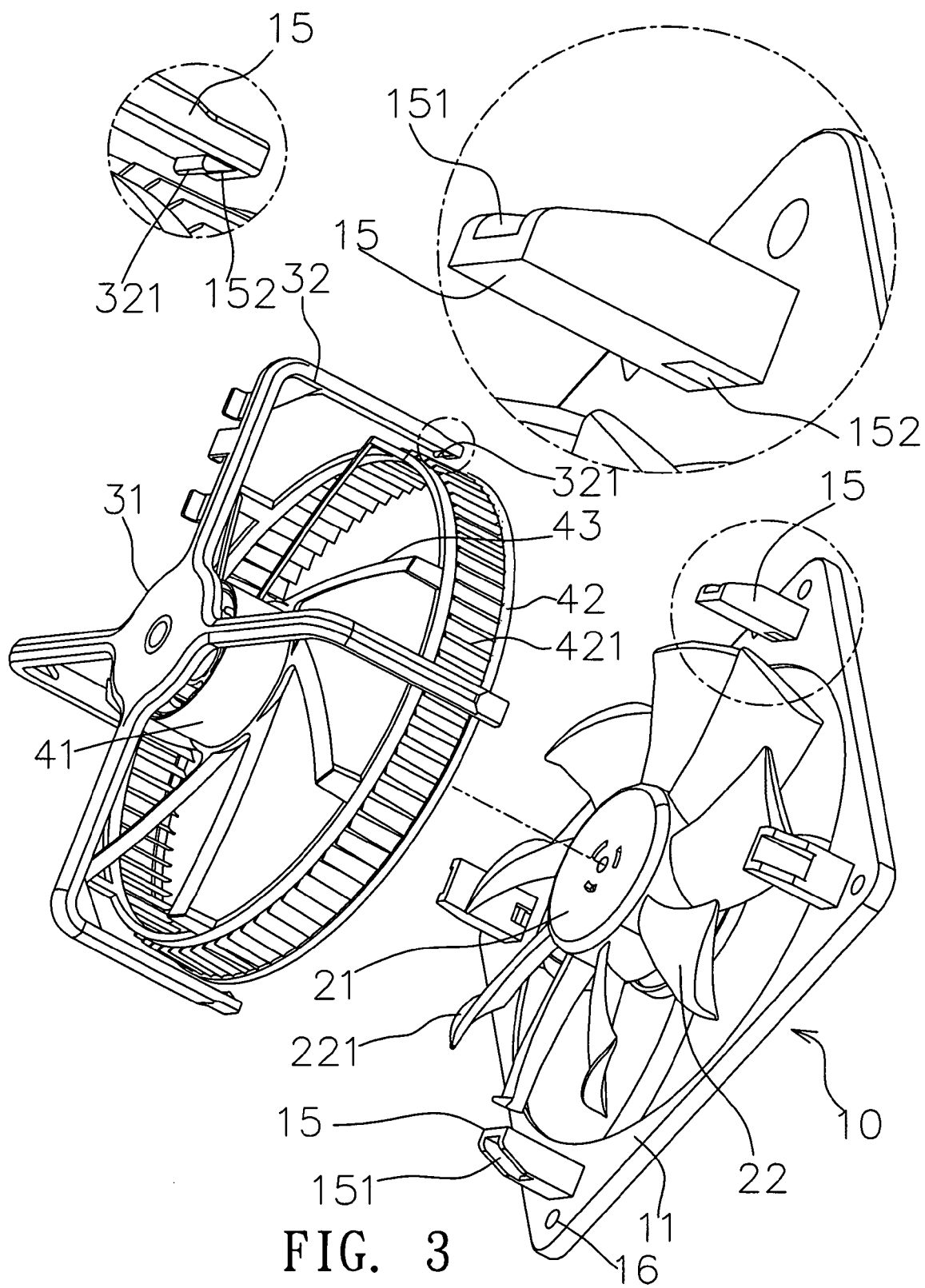
FIG. 3 is a schematic view of a partial assembly of the present invention.
Figure 4:
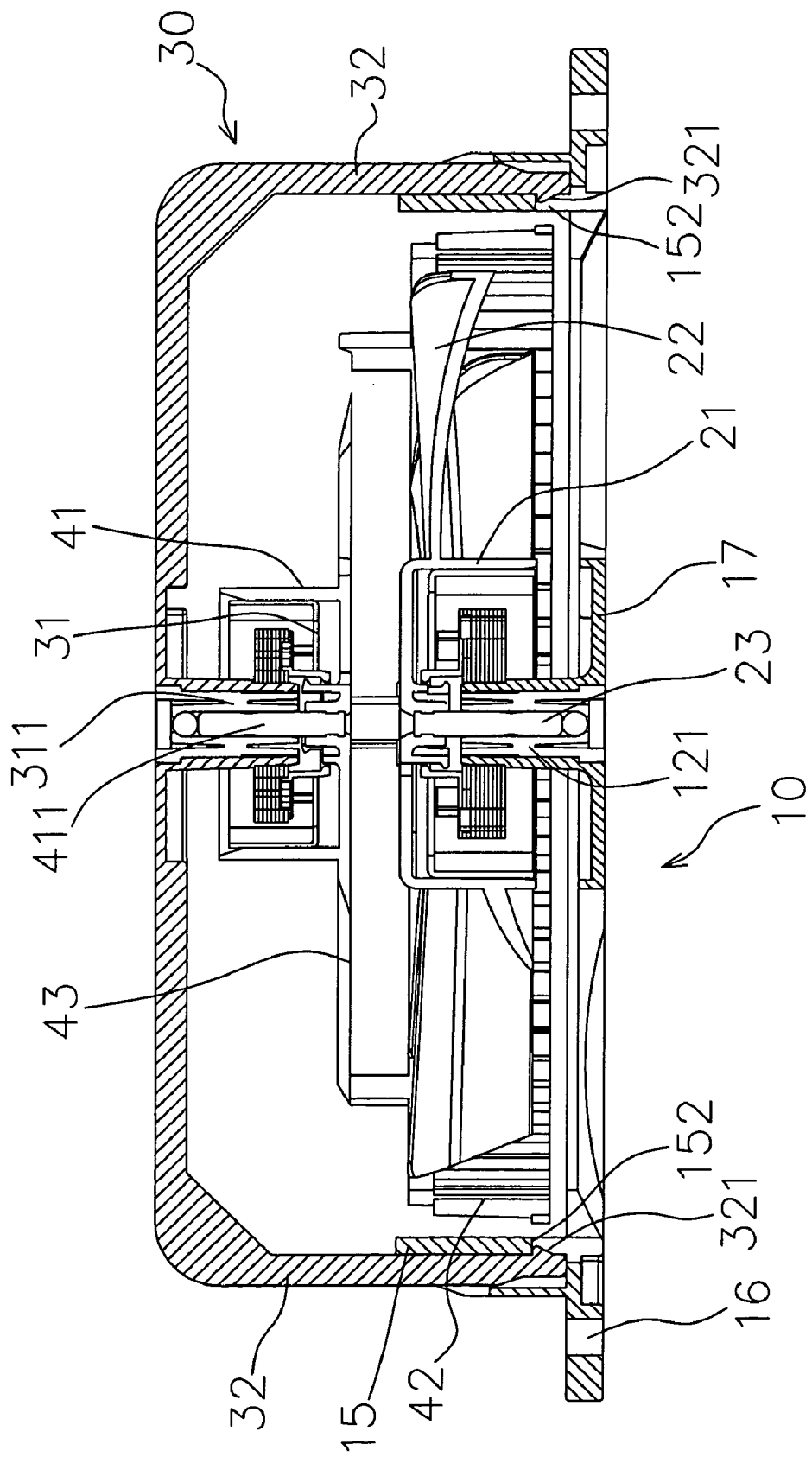
FIG. 4 is a cross-sectional view of the present invention.

The frame-fan device 40 is installed onto the support frame device 30, and the frame-fan device 40 includes a frame-fan base 41 at the center position of the frame-fan device 40 and a frame-fan frame 42 at the periphery of the frame-fan device 40, and the frame-fan base 41 and the frame-fan frame 42 are coupled by a plurality of connecting support stands 43 to form a plurality of penetrating portions 44, wherein the frame-fan base 41 has a frame-fan axle 411 disposed at the center position of the frame-fan base 41 and an internal ring 412 disposed at an internal periphery of the frame-fan base 41, and the internal ring 412 is generally a magnet, such that the internal ring 412 is a rotor assembly, and the frame-fan motor 31 is a stator assembly. The frame-fan frame 42 includes a first frame ring 422 coupled to the connecting support stand 43 and a second frame ring 423 with an interval corresponding to the first frame ring 422, and a plurality wing plates 421 are disposed between the first frame ring 422 and the second frame ring 423, and a gap 424 is disposed at an appropriate position between the wing plates 421. With reference to FIGS. 2A and 2B, the wing plate 421 is installed with different horizontal angles (wherein the horizontal angle is α, and 0°<α<90°) or different inclination angles (wherein the inclination angle is β, and 0°<β<180°), such that the gaps 424 produce different spatial modes for different flowing-aid or air turbulence methods. When the frame-fan device 40 is assembled, the frame-fan base 41 is sheathed at the frame-fan motor 31, and the frame-fan axle 411 is inserted and connected into the connecting axle hole 311, such that the frame-fan device 40 is driven and rotated by the frame-fan motor 31, and the wing plates 421 of the frame-fan frame 42 are disposed around the external periphery of the vane 22 and perpendicular to the vane 22.

When the heat dissipating fan structure of a dual motor is operated, power is turned on to operate the fan motor 12 and the frame-fan motor 31, wherein the fan motor 12 drives the fan 20 to rotate, and the air suction effect of the vane 22 sucks air to flow towards the through portions 14 of the fan base 11 and the penetrating portions 44 of the frame-fan device 40 (wherein the air flows towards the front and rear sides of the vane 22 linearly). In the meantime, the frame-fan motor 31 drives the frame-fan frame 42 to rotate, so that surrounding air can enter into the frame-fan frame 42 through the gaps 421 among the wing plates 421, and the air entering into the frame-fan frame 42 will produce an appropriate impact with the air sucked by the vane 22 to produce a multi-directional or expanded airflow to improve the blowing effect as well as the heat dissipating or cooling effect of the fan.

If air is blown towards a desired heat dissipating object (such as a CPU) during an application of the present invention, then the frame-fan frame 42 will be driven to increase the airflow from a sideway direction and concentrate the increased airflow towards the desired heat dissipating object in order to improve the heat dissipating effect. If air is extracted from the desired heat dissipating object (such as a CPU), then the frame-fan frame 42 will be driven to increase the efficiency of the fan to extract hot air produced by the desired heat dissipating object in order to improve the heat dissipating effect.

In the heat dissipating fan structure of a dual motor in accordance with the present invention, the frame-fan base and the plurality wing plates disposed thereon produce an auxiliary airflow from a sideway direction. After the auxiliary airflow is entered from a lateral side to produce an appropriate impact with the main airflow of the vane, the final airflow of the fan is a multi-directional and expanded airflow to give a good blowing effect for a larger area and provide a better heat dissipating or cooling effect of the fan, so as to enhance the heat dissipating efficiency and the practical function of the fan.

In summation of the above description, the present invention herein enhances the performance than the conventional structure and further complies with the patent application requirements and is duly filed for patent application. While the invention is described in some detail hereinbelow with reference to certain illustrated embodiments, it is to be understood that there is no intent to limit the scope of the invention to those embodiments. On the contrary, the aim is to cover all modifications, alternatives and equivalents falling within the spirit and scope of the invention as defined by the appended claims.

What is claimed is:

1. A heat dissipating fan structure of a dual motor, comprising:
   a base device, including a fan base, and said fan base including a fan motor;
   a fan, coupled and rotated by said fan motor, and including a plurality of vanes;
   a support frame device, disposed at said fan base, and including a frame-fan motor;
   a frame-fan device, coupled and rotated by said frame-fan motor, and including a frame-fan frame, and said frame-fan frame including a plurality wing plates, and said wing plates being disposed at an external periphery of said fan, and a gap being disposed between said wing plates.

2. The heat dissipating fan structure of a dual motor according to claim 1, wherein said fan base includes a motor base disposed at the center position of said fan base for installing said fan motor, and coupled by a plurality of connecting portions and said fan base to form a plurality of through portions separated by said connecting portions.

3. The heat dissipating fan structure of a dual motor according to claim 1, wherein said wing plate on said frame-fan frame is substantially perpendicular to said vane on said fan.

4. The heat dissipating fan structure of a dual motor according to claim 1, wherein said support frame device includes a support stand base for installing said frame-fan motor and a plurality of support stands extended outward from the periphery of said support stand base, and said frame-fan motor includes a connecting axle hole.

5. The heat dissipating fan structure of a dual motor according to claim 1, wherein said frame-fan device further comprises a frame-fan base disposed at the center position of said frame-fan device and a plurality of connecting support stand coupled between said frame-fan base and said frame-fan frame, and a plurality penetrating portions formed between said plurality of connecting support stands.

6. The heat dissipating fan structure of a dual motor according to claim 5, wherein said frame-fan base includes a frame-fan axle disposed at the center position of said frame-fan base, and an internal ring disposed around of the internal periphery of said frame-fan base.

7. The heat dissipating fan structure of a dual motor according to claim 6, wherein said internal ring is a magnet.

8. The heat dissipating fan structure of a dual motor according to claim 1, wherein said wing plate has an adjustable horizontal angle or inclination angle, such that said gap produces different spatial modes for different flow-aiding or air turbulence methods.

9. The heat dissipating fan structure of a dual motor according to claim 8, wherein said wing plate has a horizontal angle falling within a range of 0°~90°.

10. The heat dissipating fan structure of a dual motor according to claim 8, wherein said wing plate has an inclination angle falling within a range of 0°~180°.

* * * * *